(12) United States Patent
Yoo et al.

(10) Patent No.: US 12,266,590 B2
(45) Date of Patent: Apr. 1, 2025

(54) DUAL SIDE DIRECT COOLING SEMICONDUCTOR PACKAGE

(71) Applicant: SEMICONDUCTOR COMPONENTS INDUSTRIES, LLC, Phoenix, AZ (US)

(72) Inventors: Inpil Yoo, Bavaria (DE); Jerome Teysseyre, Scottsdale, AZ (US); Oseob Jeon, Seoul (KR); Keunhyuk Lee, Suzhou (CN); Michael J. Seddon, Gilbert, AZ (US)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 478 days.

(21) Appl. No.: 17/806,961

(22) Filed: Jun. 15, 2022

(65) Prior Publication Data
US 2023/0019930 A1 Jan. 19, 2023

Related U.S. Application Data

(60) Provisional application No. 63/203,235, filed on Jul. 14, 2021.

(51) Int. Cl.
*H01L 23/44* (2006.01)
*H01L 23/40* (2006.01)
*H05K 7/20* (2006.01)

(52) U.S. Cl.
CPC ......... *H01L 23/44* (2013.01); *H05K 7/20236* (2013.01); *H01L 2023/405* (2013.01);
(Continued)

(58) Field of Classification Search
CPC ... H01L 23/44; H01L 23/367; H01L 23/3107; H01L 2023/405; H01L 2023/4056;
(Continued)

(56) References Cited

U.S. PATENT DOCUMENTS 7,911,792 B2 3/2011 Liang et al.
8,094,454 B2 1/2012 Lowry
(Continued)

FOREIGN PATENT DOCUMENTS

JP 200557130 A 3/2005
JP 2013179104 A 9/2013

OTHER PUBLICATIONS

Evaluation of the PCB-embedding technology for a 3.3 KW converter, Remy C ' AILLAUD? , Johan Le Lesle' †, Cyril Buttay? , Florent Morel? , Roberto Mrad†, Nicolas Degrenne†, Stefan Mollov† ? Univ. Lyon, INSA—Lyon, CNRS, Ecole Centrale de Lyon, F-69621 ' † Mitsubishi Electric R&D Centre Europe, 1 allee de Beaulieu F-35708 Rennes, France, 2019.
(Continued)

*Primary Examiner* — Mamadou L Diallo
(74) *Attorney, Agent, or Firm* — IPTechLaw

(57) ABSTRACT

Implementations of a semiconductor package may include one or more power semiconductor die included in a die module; a first heat sink directly coupled to one or more source pads of the die module; a second heat sink directly coupled to one or more drain pads of the die module; a gate contact coupled with one or more gate pads of the die module; and a coating coupled directly to the die module. The gate contact may be configured to extend through an immersion cooling enclosure.

20 Claims, 3 Drawing Sheets

(52) U.S. Cl.
CPC ............... *H01L 2023/4056* (2013.01); *H01L 2023/4068* (2013.01); *H01L 2023/4087* (2013.01)

(58) Field of Classification Search
CPC ......... H01L 2023/4068; H01L 23/3736; H01L 2023/4087; H01L 23/4012; H01L 2224/18; H05K 7/20236
See application file for complete search history.

(56) References Cited

U.S. PATENT DOCUMENTS

| | | | |
|---|---|---|---|
| 8,680,666 B2 | 3/2014 | Hauenstein | |
| 8,934,250 B2 | 1/2015 | Campbell et al. | |
| 10,194,559 B2 | 1/2019 | Saito | |
| 2007/0145540 A1 | 6/2007 | Mochida | |
| 2009/0160046 A1 | 6/2009 | Otremba et al. | |
| 2009/0283919 A1* | 11/2009 | Tsui | H01L 24/41 257/E23.141 |
| 2010/0032825 A1* | 2/2010 | Elliott | H01L 21/50 257/E23.06 |
| 2011/0122583 A1* | 5/2011 | Lowry | H01L 23/44 361/699 |
| 2014/0145319 A1 | 5/2014 | Meinhold et al. | |
| 2016/0358838 A1* | 12/2016 | Basler | H01L 23/24 |
| 2018/0286702 A1 | 10/2018 | Kawashima et al. | |
| 2019/0333909 A1 | 10/2019 | Sugita et al. | |
| 2020/0098870 A1 | 3/2020 | Estacio et al. | |
| 2020/0126890 A1* | 4/2020 | Singh | H01L 23/427 |
| 2020/0183099 A1* | 6/2020 | Grehn | G02B 6/4214 |
| 2021/0296217 A1* | 9/2021 | Tang | H01L 23/49575 |
| 2021/0313289 A1* | 10/2021 | McPherson | H01L 23/5386 |
| 2022/0238413 A1* | 7/2022 | Grassmann | H01L 23/3735 |
| 2023/0268332 A1* | 8/2023 | Tang | H01L 23/427 257/675 |

OTHER PUBLICATIONS

Embedded MOSFET boost for 48V powertrain designs, May 6, 2019 //By Nick Flaherty. https://www.eenewspower.com/en/embedded-mosfet-boost-for-48v-powertrain-designs/.

Optimized Power Modules for Silicon Carbide MOSFET, Guillaume Regnat, Pierre-Olivier Jeanniin, Jeffrey Ewanchuk, David Frey, Stefan Mollov, Jean-Paul Ferrieux, Univ. Grenoble Alpes, CNRS, G2Elab, F-38000, Grenoble, France, Mitsubishi Electric R&D Centre Europe, F-35000, Rennes, France (IEEE 978-1-5090-0737-0/16).

Evolution and Future of Embedding Technology (by Dr Andreas Ostmann), Fraunhofer IZM, Berlin Gustav-Meyer-Allee 25, 13355 Berlin, Germany.

Embedded die for power: a new era for the advanced packaging industry?—An interview with Infineon Technologies and Schweizer Electronic, Printed Nov. 21, 2019. https://www.i-micronews.com/embedded-die-for-power-a-new-era-for-the-advanced-packaging-industry-an-interview-with-infineon-technologies-and-schweizer-electronic/?cn-reloaded=1&cn-reloaded=1.

\* cited by examiner

DUAL SIDE DIRECT COOLING SEMICONDUCTOR PACKAGE

CROSS REFERENCE TO RELATED APPLICATIONS

This document claims the benefit of the filing date of U.S. Provisional Patent Application 63/203,235, entitled "Dual Side Direct Cooling Power Module Package" to Yoo, et al., which was filed on Jul. 14, 2021, the disclosure of which is hereby incorporated entirely herein by reference.

BACKGROUND

1. Technical Field

Aspects of this document relate generally to packaging systems, such as packaging systems for semiconductor die. More specific implementations involve packaging systems for power semiconductor die.

2. Background

Packaging systems have been devised that permit formation of interconnects between semiconductor die and a circuit or motherboard to which the die are ultimately electrically connected. Semiconductor packages can contain additional components that allow for routing of the electrical signals to various pads and structures on the semiconductor die.

SUMMARY

Implementations of a semiconductor package may include one or more power semiconductor die included in a die module; a first heat sink directly coupled to one or more source pads of the die module; a second heat sink directly coupled to one or more drain pads of the die module; a gate contact coupled with one or more gate pads of the die module; and a coating coupled directly to the die module. The gate contact may be configured to extend through an immersion cooling enclosure.

Implementations of semiconductor packages may include one, all, or any of the following:

The package may include where an N contact, a P contact, a source contact, a drain contact, and an alternating current out contact may be each configured to extend through an immersion cooling enclosure.

The package may include a second die module with one or more source pads directly coupled to the second heat sink and a third heat sink directly coupled to one or more drain pads of the second die module.

The package may include a third die module with one or more source pads directly coupled to the third heat sink and a fourth heat sink directly coupled to one or more drain pads of the third die module.

The package may include at least one direct current link capacitor electrically coupling at least a source contact and a drain contact.

The sintering material may couple the first heat sink with the one or more source pads and the second heat sink with the one or more drain pads.

The package may include where only a die module may be used.

The package may include where no substrate may be included.

Implementations of a semiconductor package assembly may include an immersion cooling enclosure including a dielectric coolant therein; and a semiconductor package immersed in the dielectric coolant. The semiconductor package may include one or more power semiconductor die included in a die module; at least a first heat sink directly coupled to one or more source pads of the die module; a drain contact coupled with one or more drain pads of the die module; a gate contact coupled with one or more gate pads of the die module; and a coating coupled directly to exposed portions of the die module. The drain contact, the gate contact, and a source contact may be configured to extend through the immersion cooling enclosure.

Implementations of a semiconductor package assembly may include one, all, or any of the following:

The drain contact may be coupled with a second heat sink directly coupled to the one or more drain pads of the die module.

The assembly may include a second die module with one or more source pads directly coupled to the second heat sink and a third heat sink directly coupled to one or more drain pads of the second die module.

The assembly may include a third die module with one or more source pads directly coupled to the third heat sink and a fourth heat sink directly coupled to one or more drain pads of the third die module.

The assembly may include at least one direct current link capacitor electrically coupling at least a source contact and a drain contact.

The sintering material may couple the first heat sink with the one or more source pads.

The assembly may include where only a die module may be used.

The assembly may include where no substrate may be included in the semiconductor package.

Implementations of a method of making a semiconductor package assembly may include providing a die module including one or more power semiconductor die therein; directly coupling at least a first heat sink to one or more source pads of the die module; coupling a drain contact with one or more drain pads of the die module; coupling a gate contact with one or more gate pads of the die module; coupling a coating directly over exposed portions of the die module; immersing the die module in a coolant in an immersion cooling enclosure through an opening in the immersion cooling enclosure; and sealing the opening with a cap, the cap including a signal opening therein.

Implementations of a method of making a semiconductor package assembly may include one, all, or any of the following:

The method may include directly coupling the drain contact with a second heat sink at one or more drain pads of the die module.

The method may include directly coupling a second die module with one or more source pads to the second heat sink and directly coupling a third heat sink to one or more drain pads of the second die module.

The method may include wherein directly coupling at least the first heat sink to the one or more source pads of the die module further may include sintering using a silver sintering material.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended semiconductor packages will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such semiconductor packages, and implementing components and methods, consistent with the intended operation and methods.

Figure 1:
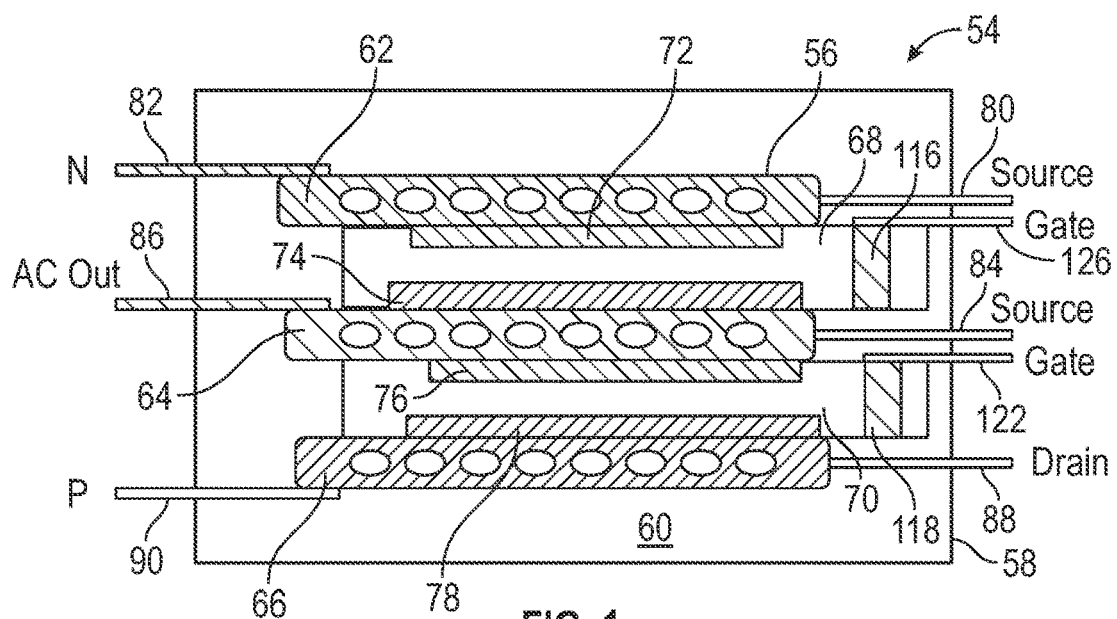
FIG. 1 is a cross sectional view of an implementation of a semiconductor package in an immersion cooling enclosure.

Referring to FIG. 1, an implementation of a semiconductor package assembly 54 is illustrated that includes semiconductor package 56 coupled into an immersion cooling enclosure 58 that contains coolant 60. The immersion cooling enclosure 58 may in various implementations include both liquid phase coolant and vapor phase coolant. However, in other implementations, as illustrated in FIG. 1, the coolant 60 may be only liquid phase in the immersion cooling enclosure 58. As used herein, "immersion cooling" includes where at least a portion of the semiconductor package 56 is immersed in a liquid phase of the coolant and thus includes situations where single phase or two phase coolant is employed in an immersion cooling enclosure. As illustrated in FIG. 1, the immersion cooling enclosure 58 is included in a dual side direct cooling semiconductor assembly, where coolant, whether liquid or vapor, is able to contact both sides of the semiconductor package 56 mounted in the enclosure 58.

The immersion cooling enclosure 58 may be self-contained and a closed system without an outlet relying on ambient or external forced convection cooling of the outer surface of the enclosure to remove heat transferred from the coolant 60 (for both two phase and single phase coolant situations). In other implementations, the immersion cooling enclosure 58 may be coupled with a cooling exchanger which receives heated coolant 60 from the interior of the enclosure 58, removes heat therefrom, and then cycles the cooled coolant back to the immersion cooling enclosure. In some implementations, a cooling exchanger may receive vaporized coolant and then condense it using a heat exchanger to return liquid coolant to the enclosure. In other implementations, however, the cooling exchanger may only receive and cool liquid coolant from the immersion cooling enclosure even where two phases of the coolant are present in the enclosure. A wide variety of enclosure types and cooling exchange types may be constructed using the principles disclosed in this document. In particular implementations, the coolant 60 used may be a chemically inert coolant. In other implementations, the coolant used may be a dielectric fluid. In some implementations, the coolant may be one of the inert and dielectric coolants marketed under the tradename FLUORINERT by 3M of St. Paul, Minnesota.

The structure of the semiconductor package 56 includes three heat sinks 62, 64, 66 which are each directly coupled in a stack with two die modules 68, 70 which each include at least one semiconductor die (not separately illustrated in FIG. 1 for ease of illustration). For the die module 68, source pad(s) 72 is directly coupled to heat sink 62 and drain pad(s) 74 is directly coupled to heat sink 64. For die module 70, the source pad(s) 76 is directly coupled to heat sink 62 and the drain pad(s) 78 are directly coupled to heat sink 66. Unlike the heat sinks illustrated in the package implementations of FIGS. 1-3, the heat sinks 62, 64, 66 are not electrically isolated from the die modules 68, 70 but actually act as electrical connectors. Heat sink 62 provides an electrical connection for source connector 80 and N electrical connector 82. Heat sink 64 provides an electrical connection for source connector 84 and alternating current (AC) out connector 86. Finally, heat sink 66 provides an electrical connection for drain connector and P connector 90.

The ability to directly couple the pads of the die modules 68, 70 to the metal material of heat sinks 62, 64, 66 may allow for an increase in thermal performance by allowing for heat transfer from the semiconductor die to take place using metal-to-metal connections direct to the metal of the heat sinks. The heat sinks 62, 64, 66 may be constructed of any of a wide variety of materials, including, by non-limiting example, metals, metal alloys, copper, copper alloys, aluminum, aluminum alloys, or any other thermally conductive material. In some implementations where a heat sink may not need to be electrically conductive, alumina may be used as a material for the heat sink. As illustrated, the heat sinks 62, 64, 66 may include one or more openings therein which may be any opening type disclosed in this document designed to increase the heat transfer capability of the heat sink. In some implementations, a coating material may be applied to the heat sinks to assist with protection from corrosion depending on the material of the coolant, but in many implementations, no coating for the heat sink may be used.

Figure 2:
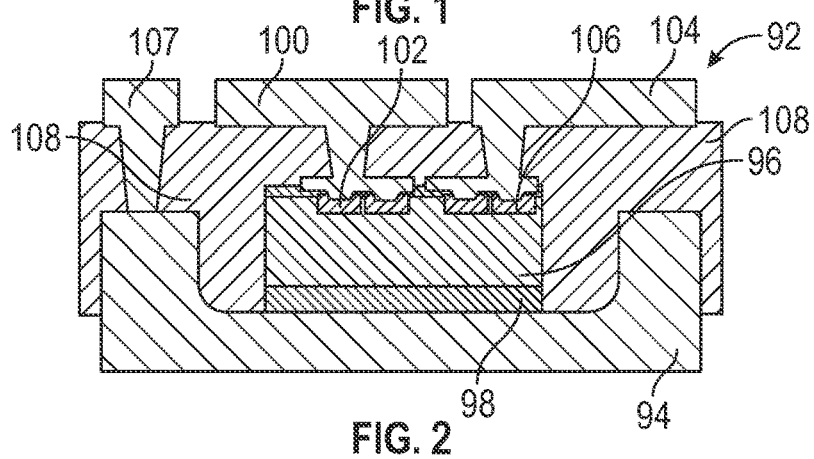
FIG. 2 is a cross sectional view of a portion of an implementation of a die module.
Figure 3:
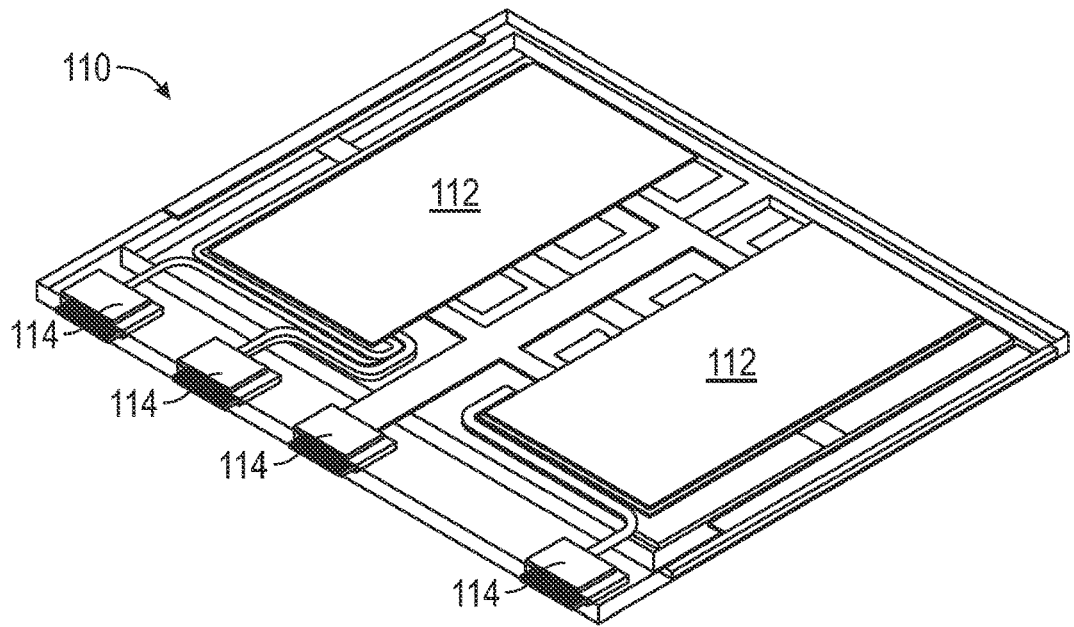
FIG. 3 is a perspective view of an implementation of a die module.

Referring to FIG. 2, a cross section view of an implementation of a die module 92 is illustrated. A wide variety of structures for die modules may be utilized in various package implementations disclosed herein and so the structure of FIG. 2 is merely for the exemplary purposes of this disclosure. As illustrated, a leadframe 94 (made of copper or any electrically conductive material disclosed herein) is coupled to the drain side/drain 98 of semiconductor die 96. Die module source pad 100 is coupled to source pads 102 of the die 96 and die module gate pad 104 is coupled to gate pads 106 of the die 96. In this implementation, a die module drain pad 107 is also included coupled with the leadframe 94. A mold compound or other electrically insulative material 108 is formed around the semiconductor die 96 and leadframe 94. FIG. 3 is a perspective view of another implementation of a die module 110 that shows source pads 112 and gate pads 114 that are routed out to an edge of the die module 110. Drain pads (not shown in FIG. 2) are also included in the die module 110 on the largest planar surface of the die module 110 opposite the side with the source pads 112. In this way, the die module 110 enables direct coupling with the heat sinks like those illustrated in FIG. 1 while allowing routing of the gate pad signals out to the die module gate pads 114 on the edge of the die module 110. As illustrated in FIG. 1, the die module gate pads 116, 118 are used to couple with gate connectors 120, 122. In this way, the particular structure of the die modules permits the signal and power routing needed to enable the heat sinks 62, 64, 66 to act as part of the electrical connection systems for the semiconductor package 56.

In FIG. 1, the heat sinks 62, 64, 66 are illustrated to be directly coupled with the pads of the die modules 68, 70 through use of a metal-to-metal bonding process like sintering. In some implementations of methods of forming semiconductor packages, each heat sink may be sintered one at a time to each die module; in others, however, the sintering may take place as the entire stack of heat sinks and die modules are sintered at once using a jig or other fixture to hold them in place. In some implementations, a solder may be used to form the metal-to-metal direct coupling of the heat sinks and die module pads. In some method implementations, a silver sintering material may be placed between the heat sinks and die modules and used to facilitate the metal-to-metal bond formed through the sintering process.

For example, in a first implementation of a method of forming a semiconductor package, the die modules 68, 70 may be sintered to the heat sink 64 in a first bonding step followed by sintering of the N contact heat sink 62 and the P contact heat sink 66 to the die modules 68, 70. The various N connector, P connector, AC out connector, source connectors, gate connectors, and drain connector(s) are then soldered or ultrasonically bonded at the corresponding locations on the heat sinks and die modules. The package is then inserted/fixed into the immersion cooling enclosure 58 while the connectors are routed out through one or more openings in the immersion cooling enclosure. The coolant is then added to the immersion cooling enclosure. In some implementations, one or more caps may be applied to the one or more openings in the immersion cooling enclosure to seal the connectors and prevent coolant from escaping through the one or more openings during operation. In a second implementation of a method of forming a semiconductor package, a stack formed by the three heat sinks 62, 64, 66 and the two die modules 68, 70 is initially formed and pressed together with a silver sintering material disposed between each of the components and the entire stack is then sintered simultaneously. The various connectors are then soldered or ultrasonically welded at the corresponding locations on the heat sinks and die modules. The resulting package is then placed into the immersion cooling enclosure with the connectors passing through one or more openings in the enclosure followed by addition of the coolant and sealing using various caps placed into the openings around the connectors. In these two method implementations, the portions of the die modules 68, 70 not coupled to the heat sinks remain fully exposed to the coolant 60 during operation.

Figure 4:
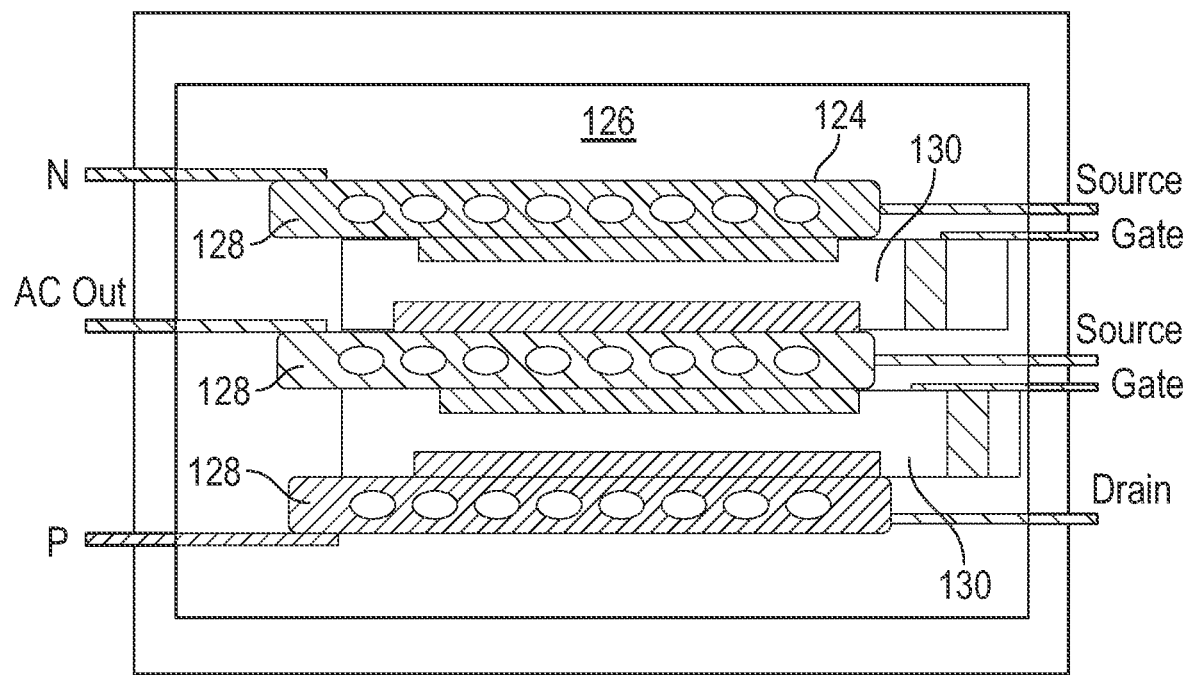
FIG. 4 is a cross sectional view of another implementation of a semiconductor package assembly showing a coating material.
Figure 5:
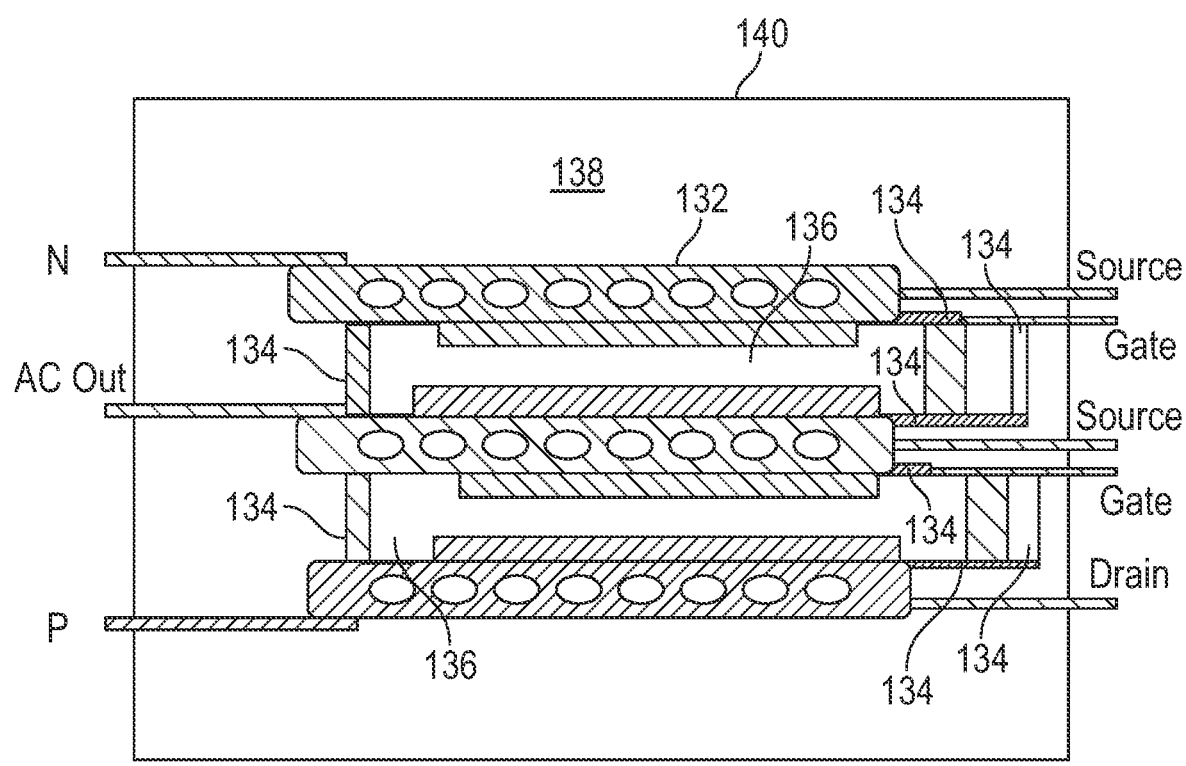
FIG. 5 is a cross sectional view of another implementation of a semiconductor package assembly showing a coating material.

In various method implementations, a coating step is included after the coupling of the various connectors to the heat sink(s) and die module(s). FIG. 4 illustrates an implementation of a semiconductor package 124 following application of a coating 126 that covers the heat sinks 128 and die modules 130 of the package. FIG. 5 illustrates a semiconductor package implementation 132 where the coating material 134 covers just those regions of the die modules 136 exposed to the coolant 138 when placed in the immersion cooling enclosure 140. A wide variety of coating configurations covering all or various exposed portions of the die modules can be constructed using the principles disclosed herein.

The coating 126, 134 can provide a large number of effects, such as, by non-limiting example, corrosion protection; ion gettering to extend longevity; physical protection during assembly; mechanical protection from coolant flow across the surface; particle/flake protection from particles from the enclosure, package, and/or assembly debris; and other positive effects resulting from protection of the material of the die modules from the coolant.

While the coating 126, 134 is illustrated in FIG. 5 as being applied to all coolant-exposed surfaces of the die modules 136, in other implementations, one, all, or any number of the surfaces/sides of the die modules 136 may be coated. The use of the coating may also allow for protection of wirebonds formed on/to the die modules as the coating may fully cover the wirebonds and mechanically and physically protect them from coolant flow and particles. The use of the coating may also assist with repairing of any components of the package during assembly as components can be tested individually first prior to full assembly. While a single layer of coating material is illustrated in FIG. 5, multiple layers of coating material(s) may be applied in various implementations each made of the same or different materials. The coating may be formed of any of a wide variety of materials, including, by non-limiting example, epoxies, novolac resins, polymer films, aluminum oxide, titanium nitride, mold compound, any combination thereof, or any other material capable of being applied to the die module and resistant to the coolant material. In particular implementations, the ability to use aluminum oxide and/or titanium nitride as the coating may result in a thin film that provides adequate protection in the environment of the immersion cooling enclosure while facilitating additional heat transfer from the die module itself. In various implementations where aluminum oxide and/or titanium nitride are used in the coating, the thickness of the coating may be, by non-limiting example, between about 1 micron to about 5 microns, between about 1.5 microns to about 3 microns, or about 1.5 microns.

In certain method implementations, where the coating has two or more layers, multiple application steps may be sequentially carried out (along with a corresponding number of curing/drying steps). For example, a gel-type material may be applied in a first coating process followed by application of a mold compound through a molding process to form a two layer coating material. In some implementations, the application process for the coating may be a printing process. In other implementations, the application process may be a molding process. In other implementations, the coating may be applied using, by non-limiting example, spraying, dipping, dispensing, chemical vapor deposition, sputtering, physical vapor deposition, film application, or any other method for forming a layer of material over a die module and/or heat sink.

In the various package implementations disclosed herein, no substrate [like a direct bonded copper (DBC) or insulated metal substrate (IMS)] are utilized because only the die modules are used to form the initial layer of mechanical and electrical interconnections with the one or more semiconductor die included therein. In this way, the thermal transfer limitations imposed by placing a ceramic-cored substrate material in the heat transfer path to the heat sinks may be eliminated as the ceramic material have a conductive heat transfer coefficients between 25 W/m*K–100 W/m*K in contrast with to the conductive heat transfer coefficient of copper at about 318 W/m*K. Furthermore, the ability to directly couple the heat sinks in metal-to-metal connections with the pads of the die modules may significantly improve heat transfer from the semiconductor die to the heat sinks.

Figure 6:
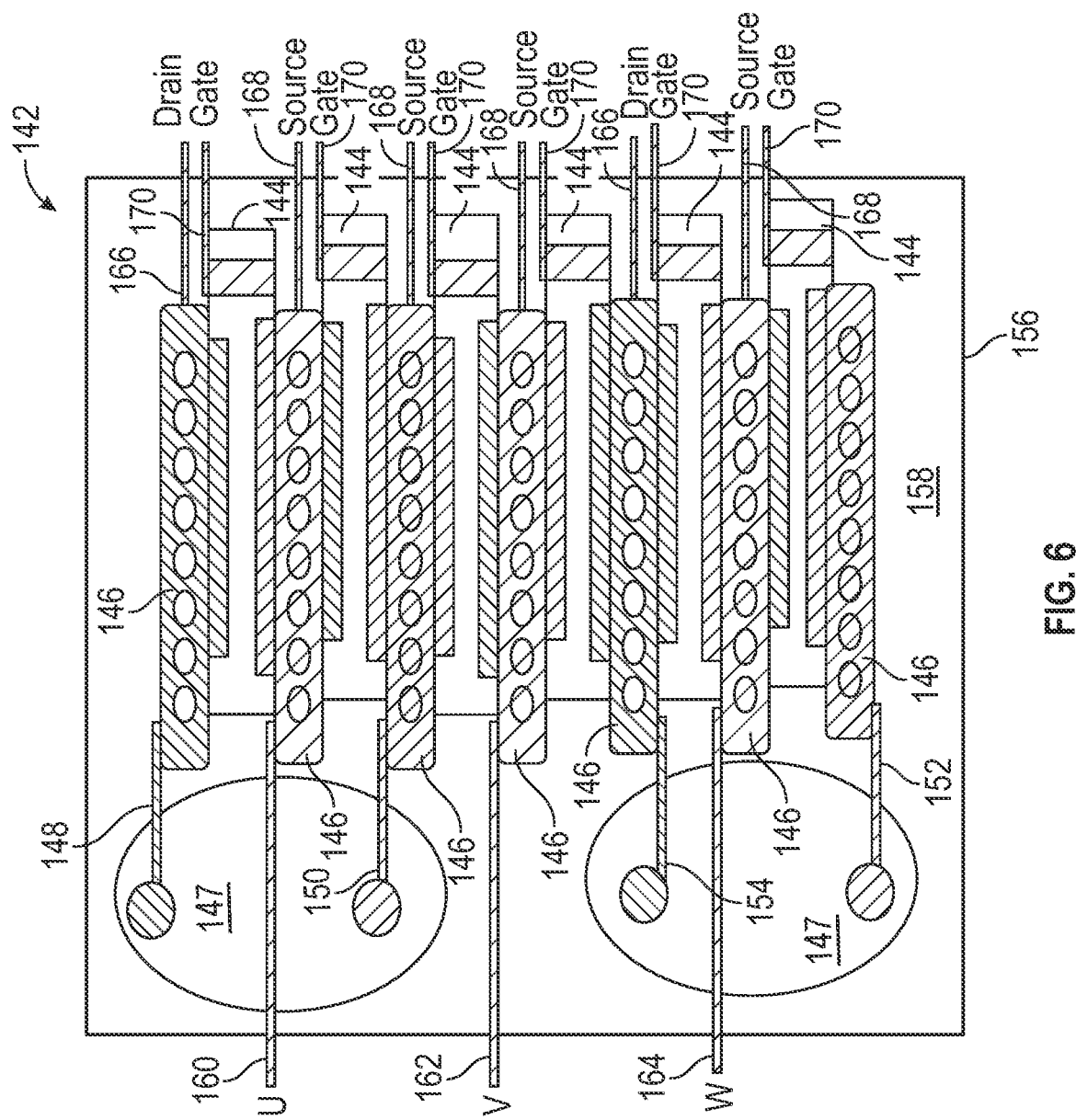
FIG. 6 is a cross sectional view of another implementation of a semiconductor package assembly.

Referring to FIG. 6, another implementation of a semiconductor package assembly 142 is illustrated. In this implementation, six die modules 144 are illustrated coupled with corresponding heat sinks. As illustrated, two direct current (DC) link capacitors 147 are included that internally connect source connector 148 with drain connector 150 and source connector 152 and drain connector 154. The use of the DC link capacitors 147 permits the interconnection of the various die modules 144 using the heat sinks 146 as part of the electrical routing inside the semiconductor package assembly 142. As illustrated, additional connectors are included that extend through openings in the immersion cooling enclosure 156 that includes coolant 158 (which may be any disclosed in this document). As this semiconductor package assembly 142 controls a three electrical phases, a U connector 160, V connector 162, and W connector 164 are included. Also included are various drain connectors 166, source connectors 168, and gate connectors 170. The connectors, as in the various implementations disclosed in this document, may extend through one or more openings in the immersion cooling enclosure 156 which are capped or otherwise sealed around the connectors. While not illustrated in FIG. 6, a coating like any disclosed herein may be included in various implementations constructed using this design.

FIG. 6 illustrates how the various semiconductor package assemblies, as they do not require a separate electrical insulation structure in addition to the immersion cooling enclosure, can be constructed in a modular fashion to include one die module, two die modules, or any desired number of die modules with a corresponding number of heat sinks to form dual sided cooling assemblies. The use of the die modules may also facilitate the exchangeability of various semiconductor die in various package assemblies and in various positions in the package assemblies. In addition, in various implementations, additional fins or projections from the heat sinks and/or die modules could be provided that could provide mechanical support to the immersion cooling enclosure and/or permit additional heat transfer from the die modules to the material of the immersion cooling enclosure. A wide variety of package versions and implementations can be constructed using the principles disclosed herein.

In places where the description above refers to particular implementations of semiconductor packages and implementing components, sub-components, methods and sub-methods, it should be readily apparent that a number of modifications may be made without departing from the spirit thereof and that these implementations, implementing components, sub-components, methods and sub-methods may be applied to other semiconductor packages.

What is claimed is:

1. A semiconductor package comprising:
   one or more power semiconductor die comprised in a die module;
   a first heat sink directly coupled to one or more source pads of the die module;
   a second heat sink directly coupled to one or more drain pads of the die module;
   a gate contact coupled with one or more gate pads of the die module; and
   a coating coupled directly to the die module;
   wherein the gate contact is configured to extend through an immersion cooling enclosure.

2. The package of claim 1, wherein an N contact, a P contact, a source contact, a drain contact, and an alternating current out contact are each configured to extend through an immersion cooling enclosure.

3. The package of claim 1, further comprising a second die module with one or more source pads directly coupled to the second heat sink and a third heat sink directly coupled to one or more drain pads of the second die module.

4. The package of claim 3, further comprising a third die module with one or more source pads directly coupled to the third heat sink and a fourth heat sink directly coupled to one or more drain pads of the third die module.

5. The package of claim 4, further comprising at least one direct current link capacitor electrically coupling at least a source contact and a drain contact.

6. The package of claim 1, wherein a sintering material couples the first heat sink with the one or more source pads and the second heat sink with the one or more drain pads.

7. The package of claim 1, wherein only a die module is used.

8. The package of claim 1, wherein no substrate is included.

9. A semiconductor package assembly comprising:
   an immersion cooling enclosure comprising a dielectric coolant therein; and
   a semiconductor package immersed in the dielectric coolant, the semiconductor package comprising:
      one or more power semiconductor die comprised in a die module;
      at least a first heat sink directly coupled to one or more source pads of the die module;
      a drain contact coupled with one or more drain pads of the die module;
      a gate contact coupled with one or more gate pads of the die module; and
      a coating coupled directly to exposed portions of the die module;
   wherein the drain contact, the gate contact, and a source contact are configured to extend through the immersion cooling enclosure.

10. The assembly of claim 9, wherein the drain contact is coupled with a second heat sink directly coupled to the one or more drain pads of the die module.

11. The assembly of claim 10, further comprising a second die module with one or more source pads directly coupled to the second heat sink and a third heat sink directly coupled to one or more drain pads of the second die module.

12. The assembly of claim 11, further comprising a third die module with one or more source pads directly coupled to the third heat sink and a fourth heat sink directly coupled to one or more drain pads of the third die module.

13. The assembly of claim 12, further comprising at least one direct current link capacitor electrically coupling at least a source contact and a drain contact.

14. The assembly of claim 9, wherein a sintering material couples the first heat sink with the one or more source pads.

15. The assembly of claim 9, wherein only a die module is used.

16. The assembly of claim 9, wherein no substrate is included in the semiconductor package.

17. A method of making a semiconductor package assembly, the method comprising:

providing a die module comprising one or more power semiconductor die therein;

directly coupling at least a first heat sink to one or more source pads of the die module;

coupling a drain contact with one or more drain pads of the die module;

coupling a gate contact with one or more gate pads of the die module;

coupling a coating directly over exposed portions of the die module;

immersing the die module in a coolant in an immersion cooling enclosure through an opening in the immersion cooling enclosure; and sealing the opening with a cap, the cap comprising a signal opening therein.

18. The method of claim 17, further comprising directly coupling the drain contact with a second heat sink at one or more drain pads of the die module.

19. The method of claim 18, further comprising directly coupling a second die module with one or more source pads to the second heat sink and directly coupling a third heat sink to one or more drain pads of the second die module.

20. The method of claim 17, wherein directly coupling at least the first heat sink to the one or more source pads of the die module further comprises sintering using a silver sintering material.

* * * * *